US009693160B2

(12) United States Patent
Gyllensward et al.

(10) Patent No.: US 9,693,160 B2
(45) Date of Patent: Jun. 27, 2017

(54) SAFE AUDIO PLAYBACK IN A HUMAN-MACHINE INTERFACE

(71) Applicant: BOMBARDIER TRANSPORTATION GMBH, Berlin (DE)

(72) Inventors: Erik Gyllensward, Vasteras (SE); Jochen Wendebaum, Vasteras (SE)

(73) Assignee: Bombardier Transportation GmbH, Berlin (DE)

( * ) Notice: Subject to any disclaimer, the term of this patent is extended or adjusted under 35 U.S.C. 154(b) by 0 days.

(21) Appl. No.: 14/441,607

(22) PCT Filed: Nov. 19, 2013

(86) PCT No.: PCT/EP2013/074123
§ 371 (c)(1),
(2) Date: May 8, 2015

(87) PCT Pub. No.: WO2014/079823
PCT Pub. Date: May 30, 2014

(65) Prior Publication Data

US 2015/0289072 A1 Oct. 8, 2015

(30) Foreign Application Priority Data

Nov. 20, 2012 (EP) .................................... 12193376

(51) Int. Cl.
*H03G 11/00* (2006.01)
*H04R 29/00* (2006.01)
(Continued)

(52) U.S. Cl.
CPC .......... *H04R 29/001* (2013.01); *G08B 29/10* (2013.01); *G08B 3/10* (2013.01)

(58) Field of Classification Search
CPC .......... H04R 3/007; H04R 3/00; H04R 3/002; H04R 29/001; H04R 29/003;
(Continued)

(56) References Cited

U.S. PATENT DOCUMENTS

| | | | |
|---|---|---|---|
| 5,740,716 | A | 4/1998 | Stilson |
| 2007/0112563 | A1 | 5/2007 | Krantz et al. |

(Continued)

FOREIGN PATENT DOCUMENTS

| | | |
|---|---|---|
| CN | 1076801 | 9/1993 |
| CN | 101569092 | 10/2009 |

(Continued)

OTHER PUBLICATIONS

International Search Report prepared by the European Patent Office on Mar. 6, 2014, for International Application No. PCT/EP2013/074123.

*Primary Examiner* — Leshui Zhang
(74) *Attorney, Agent, or Firm* — The Webb Law Firm

(57) ABSTRACT

The present invention relates to an audio processing system (100) for providing safe audio playback. An audio controller (110) outputs an intermediate audio signal (M) having a predefined test segment comprising a predefined test frequency component. An audio synthesis stage (120) provides, based on the intermediate audio signal, an output audio signal (P) for use in audio playback. An audio test is performed based on a first segment of the output audio signal corresponding to the test segment of the intermediate audio signal, and a safety processor (150) declares correct the operation of the audio synthesis stage in case the result of the audio test is positive. The safety processor declares correct the operation of a frequency monitor (130) if both the
(Continued)

frequency monitor and a frequency-selective audio sensor (140) detect the test frequency in the first segment of the output audio signal.

19 Claims, 6 Drawing Sheets

(51) Int. Cl.
*G08B 29/10* (2006.01)
*G08B 3/10* (2006.01)

(58) Field of Classification Search
CPC .... H04R 29/004; H04R 29/00; H04R 29/002; H03F 1/52; H03F 2200/331; H03F 1/30; H03F 2200/03; H03G 11/00; H03G 11/008; H03G 11/02; H03G 11/04; H04S 7/301; H04S 3/00; G08B 23/00–31/00; G10K 15/00–15/12
USPC .... 381/55, 56, 57, 58, 164, 94.3, 94.9, 94.8, 381/94.1, 28, 61, 119, 120, 121, 103, 381/102, 101, 100, 99, 93, 83, 71.14, 381/71.12, 71.11, 71.1, 317, 318, 320, 381/334, 59; 700/94; 330/298, 207 P
See application file for complete search history.

(56) References Cited

U.S. PATENT DOCUMENTS

| | | | | |
|---|---|---|---|---|
| 2009/0273463 | A1 | 11/2009 | Morwood et al. | |
| 2010/0161089 | A1* | 6/2010 | Phelippeau | G08B 3/10 700/94 |

FOREIGN PATENT DOCUMENTS

| | | | | |
|---|---|---|---|---|
| JP | 7287595 | A | 10/1995 | |
| JP | 2007-232939 | | 9/2007 | |
| JP | 2009518662 | A | 5/2009 | |
| JP | 4506004 | | 7/2010 | |
| JP | 2010166187 | A | 7/2010 | |
| JP | EP 2229006 | A1 * | 9/2010 | H04R 29/001 |
| JP | 201285040 | A | 4/2012 | |
| WO | WO 2012/152323 | A1 | 11/2012 | |

* cited by examiner

SAFE AUDIO PLAYBACK IN A HUMAN-MACHINE INTERFACE

CROSS REFERENCE TO RELATED APPLICATIONS

This application is a national stage application under 35 U.S.C. 371 and claims the benefit of PCT Application No. PCT/EP2013/074123 having an international filing date of Nov. 19, 2013, which designated the United States, which PCT application claimed the benefit of European Patent Application No. 12193376.6 filed Nov. 20, 2012, the disclosures of each of which are incorporated herein by reference.

TECHNICAL FIELD

The present invention relates to an audio processing device and a corresponding method, adapted to provide safe playback of an audio signal.

BACKGROUND

In many systems and devices, audio signals are used to attract the attention of a human user. Such audio signals may be safety critical and it may be important to ensure that the audio signals are heard and/or acknowledged by the user. In some systems, safety critical audio signals are played at a loud volume and/or are played repeatedly to increase the probability that they are heard. It may also be important to ensure that audio signals are played correctly, i.e. that the user hears an intended and correctly reproduced signal or message in order to be able to interpret it in the way the system expected.

US 2010/161089 A1 discloses a sound message generating device with integrated defect detection. The detection principle used therein consists in digitally superposing, onto the input of a digital-analogue converter receiving the samples of the audio sequences to be restored, a digital test signal having a spectrum of frequencies outside of the spectrum of frequencies of the audio sequences of the data bank, and in extracting a corresponding test signal, the characteristics of which are compared with those of the test signal applied as input.

A safety system in a vehicle may be designed to ask the driver of the vehicle, via an audio signal or message, to perform a safety routine to ensure that the driver is present and is able to continue driving the vehicle. As a safety mechanism, the vehicle may be adapted to stop automatically unless the driver performs the requested safety routine within a given time period. Automatic stops caused by the driver misinterpreting or not even hearing the audio signal may be frequent in systems with poorly functioning audio processing devices, and so, it is important to ensure that the audio signal is played correctly.

At least for the above described reasons, it would be desirable to provide an audio processing system enabling more reliable (or safer) playback of audio signals and/or audio messages.

SUMMARY

An object of the present invention is to provide an audio processing system, and a corresponding method, enabling more reliable (or safer) playback of audio signals and/or audio messages. A particular object is to propose an audio processing system with good robustness against a memory failure. A second particular object is to propose an audio processing system in which an audio synthesis failure can be detected and preferably remedied. A further object is to propose an audio processing system with an integrated verification functionality for verifying (or declaring correct) one or more components or functionalities. As used herein, a component or functionality is verified when it is found to operate normally or in the intended way.

According to a first aspect of the present invention, there is provided an audio processing system comprising an audio controller, an audio synthesis stage, a frequency monitor, a frequency-selective audio sensor and a safety processor. The audio controller is operable to output an intermediate audio signal having a predefined test segment in which the audio signal comprises a predefined test frequency component. The audio synthesis stage is adapted to provide, based on the intermediate audio signal, an output audio signal for use in audio playback. The frequency monitor is adapted to monitor frequency content of the output audio signal. The frequency-selective audio sensor is tuned to the test frequency and is adapted to monitor the output audio signal. The safety processor is adapted to verify (or declare correct) the operation of the audio synthesis stage in response to a positive result of an audio test performed in a first segment of the output audio signal corresponding to the test segment of the intermediate audio signal. The safety processor is further adapted to verify (or declare correct) the operation of the frequency monitor in response to both the frequency monitor and the frequency-selective audio sensor detecting the test frequency in the first segment of the output audio signal.

According to a second aspect of the present invention, there is provided an audio processing method comprising the steps of providing an intermediate audio signal having a predefined test segment comprising a predefined test frequency component; synthesizing, based on the intermediate audio signal, an output audio signal suitable for use in audio playback; monitoring frequency content of the output audio signal; and detecting the test frequency in the output audio signal. It is to be noted that the monitoring of frequency content and the detection of the test frequency may be independent steps that may be performed in any order, e.g., these steps may be performed simultaneously in different units (i.e. in parallel). In other words, the test frequency may be detected regardless of whether or not the frequency content has been monitored.

An audio test is performed in a first segment of the output audio signal corresponding to the test segment of the intermediate audio signal. An audio synthesizing functionality is verified if the result of this audio test is positive. Further, if the test frequency is detected in the first segment of the output audio signal, and the monitoring of frequency content of the output audio signal reveals presence of the test frequency in the first segment of the output audio signal, a frequency monitoring functionality is verified.

An effect of including a predefined test segment in the intermediate audio signal is that the operation of at least some components of the audio processing system (or functionalities of the system) may be evaluated based on how these components handle the test segment. As the test segment is predefined, the evaluation of the components (or functionalities) may be performed independently of any content present in any other segments of the intermediate audio signal. If such an evaluation indicates that the operation of a component or a functionality of the system is satisfactory, the component may be verified and may thereafter be trusted. If, on the other hand, such an evaluation indicates that the operation of a component is not satisfactory, the audio processing stage may suspend audio playback of the output audio signal, e.g. by causing/instructing the audio controller, the audio synthesis stage and/or any audio playback equipment to suspend operation (e.g. until the components of the audio processing system may be evaluated again). Such an evaluation of operation of components of the audio processing system enables a more reliable (or safer) audio playback.

The predefined test segment (or data sufficient to produce the predefined test segment) may be stored in the audio generating device during manufacture, deployment or installation, or in a configuration phase, and may be included in the intermediate audio signal by the audio generating system. Alternatively, the predefined test segment may be received by the audio controller via an input or control signal.

The safety processor may be a more reliable and/or a more trusted component than at least some of the other components of the audio processing system, and may be used to verify at least some of the other components. In particular, the safety processor may execute trusted software which has been verified according to a safety standard. In this way, the reliability of the safety processor may be used to extend trust to other, a priori less reliable, components of the audio processing system. The less reliable components may for example be cheaper/simpler components, or multi-purpose components which may potentially have been affected, changed or corrupted when performing other tasks, e.g., tasks not related to safe audio playback. The use of a safety processor to verify other components in this way enables a more reliable audio playback for systems in which not all components may be trusted a priori.

The operation of the audio synthesis stage may be evaluated based on how the audio synthesis stage handles the test segment when providing the output audio signal based on the intermediate audio signal. If the audio synthesis stage provides an expected audio output signal segment based on the test segment, then it may be expected to function properly for intermediate audio signals with different content and may be verified by the safety processor. This evaluation may be performed via an audio test in which, e.g., frequency, amplitude, waveform and/or phase of the audio output signal is measured/monitored and compared with corresponding reference values. As the test segment of the intermediate audio signal is predefined, these reference values may for instance be stored in the safety processor at installation or in a configuration phase.

An effect of using both a frequency monitor and a frequency-selective audio sensor for analyzing the same audio output signal is that these two components may be used to evaluate the operation of each other. Indeed, these two components may monitor and/or detect frequencies in the output audio signal independently of each other, and if both components detect the same frequency in (the same part/segment of) the output audio signal, this may indicate that both components function properly. It may be advantageous to use structurally different components, or components with different ageing behaviors, for the frequency monitor and the frequency-selective audio sensor, to reduce the probability of a scenario where simultaneous errors in different components lead to an erroneous verification. For example, a frequency-selective audio sensor tuned (e.g. by use of dedicated hardware components and/or hard coded software) to a particular frequency may be more reliable than a general purpose frequency monitor, and may therefore be used to evaluate operation of the frequency monitor. Once operation of the frequency monitor has been verified via the frequency-selective audio sensor, it may be used to monitor frequencies possibly outside the detection range of the frequency-selective audio sensor.

The frequency-selective audio sensor may be able to detect only the test frequency (or frequencies in a narrow frequency band around it), or it may be able to detect a broader range of frequencies but may be particularly sensitive to the test frequency.

A frequency component having the predefined test frequency is included in the test segment of the intermediate audio signal. The audio synthesis stage is expected to output a first portion of the output audio signal based on the test segment, comprising a frequency component having the test frequency, i.e. the audio synthesis stage is expected to preserve the test frequency from the intermediate audio signal. Equivalently, the intermediate audio signal may contain an indication of the test frequency, and it is to be verified that (or assessed whether) the audio synthesis stage outputs the test frequency as intended. Hence, the frequency-selective audio sensor may be tuned to the predefined test frequency, and may be used to evaluate operation of the frequency monitor based on that frequency.

The intermediate audio signal may for example comprise a plurality of segments, at least one of which may have content based on a control signal or an input audio signal received by the audio controller. The test segment of the intermediate audio signal may preferably be located before such a segment, referred to as a content segment, since this may allow evaluation of components of the audio processing system before processing of the content segment. Hence, the safety processor may, in response to the evaluation indicating a malfunction, e.g. suspend/interrupt playback of the output audio signal before the content segment is played.

The test segment of the intermediate audio signal may for example consist of a single component having the predefined test frequency, i.e. its spectrum may consist of only one frequency component. Alternatively, the test segment may comprise several test frequency components, and/or several consecutive sub-segments (with respect to time), possibly having different sets of test frequency components.

The predefined test frequency may optionally be outside human hearing range. This allows for use of the test frequency in evaluating operation of components of the audio processing system without the test frequency being noticed by a human user, regardless of the volume used. Optionally, the entire test segment of the intermediate audio signal may be outside human hearing range in order for it not to be noticed by a human user.

According to an embodiment, the audio synthesis stage may be adapted to output the output audio signal in such a format that it is adapted for audio playback without further processing. For example, the audio processing system may comprise an acoustic transducer adapted to reproduce (i.e. perform playback of) the audio output signal without further processing. Optionally, the safety processor (or a dedicated test component or the like), may be adapted to detect whether the acoustic transducer is connected to the audio processing system, i.e. whether it is able to receive the output audio signal. For example, this may be done by checking that the impedance between connection points adapted to be connected to the acoustic transducer is the characteristic impedance of the acoustic transducer.

According to an embodiment, the audio synthesis stage may comprise an amplifier adapted to amplify the intermediate signal or an audio signal derived from the intermediate audio signal. For example, the audio synthesis stage may comprise a conversion stage adapted to convert the intermediate audio signal from a digital to an analogue format or representation, and the amplifier may be adapted to provide the output audio signal by amplifying the analogue representation of the intermediate audio signal. The audio test may, e.g., be configured to evaluate the amplifying functionality of the amplifier.

According to an embodiment, the audio test may involve checking whether the audio synthesis stage handles volumes correctly. The audio controller may be operable to output the test segment of the intermediate signal at a first indicated volume, i.e. the audio controller may instruct that the test segment be played at a first volume. The safety processor may be adapted to receive a first audio test signal indicating whether an actual volume in the first segment of the output signal, corresponding to the test segment of the intermediate audio signal, is equivalent to the first indicated volume, i.e. whether it is the same as the first intended volume. The first audio test signal may be provided by a test component having access to the output audio signal. For example, the frequency-selective audio sensor may be adapted to detect the test frequency at the indicated volume and to provide the first audio test signal. Alternatively, it may indicate to the safety processor the volume at which the test frequency was received and allow the safety processor to carry out the comparison.

Optionally, the audio controller of the present embodiment may be operable to output an additional test segment of the intermediate signal at a second indicated volume, different from the first volume. The audio test may be extended to evaluate how this second test segment is affected by the audio synthesis stage. The safety processor may be adapted to receive a second audio test signal indicating whether an actual volume in a second segment of the output audio signal, corresponding to the additional test segment of the intermediate audio signal, is equivalent to the second indicated volume. This second test signal may be provided similarly as the first test signal, e.g. by the frequency-selective audio sensor. By using at least two test segments with different volumes, the audio test may indicate whether the audio synthesis stage is capable of providing different volumes (or providing different amounts of amplification), preferably in a correct quantitative relationship.

According to an embodiment, the safety processor may be adapted to receive a third audio test signal from the frequency-selective audio sensor indicating a detection, in the first segment of the output audio signal, of the predefined test frequency. This third test signal may be a different test signal than those described in relation to the previous embodiments. Alternatively, the frequency-selective audio sensor may be adapted to perform a combined test, in which both frequency and volume are measured, and the test signal may indicate a result of this combined test.

According to an embodiment, the safety processor may be adapted to perform a real-time audio test based on frequency content of the output audio signal, provided by the frequency monitor. The real-time audio test may comprise comparing the provided frequency content with expected frequency content. This may for example be performed by computing one or more checksums or hash values, based on the provided frequency content and comparing these checksums or hash values with corresponding values or checksums of the expected frequency content. The expected frequency content, or the corresponding checksums or hash values, may e.g. be pre-stored in the safety processor during manufacture, deployment, installation or configuration of the audio processing system, or may be received by the safety processor from a component other than the frequency monitor. Alternatively, the frequency content and/or checksums may be determined by the safety processor, e.g. based on a reference audio signal stored in the safety processor.

A negative result of the real-time audio test may indicate that the audio output signal is incorrect, either as a consequence of storage failure, memory retrieval failure, data transmission failure or data processing. The safety processor may then optionally stop playback of the output audio signal, e.g. by instructing/controlling the audio synthesis stage, the audio controller, and/or any playback equipment to discontinue operation.

Additionally, or alternatively, the safety processor may be adapted to verify (or declare correct) the operation of at least one component upstream of the audio synthesis stage in response to a positive result of the real-time audio test. For example, the audio controller and/or a component, from which the audio controller receives an input/control signal, may be verified. An input signal or instruction received by the audio controller may comprise data from a memory. The operation or status of such a memory may, e.g., be verified in response to a positive result of the real-time audio test.

According to an embodiment, the audio controller may be adapted to receive data indicating a desired frequency (within human hearing range), and to generate, in response to receiving this data, a content segment of the intermediate audio signal having the desired frequency. Optionally, the received data may also indicate a desired volume and/or desired duration of the content segment to be generated (or the desired volume and duration may be predetermined and e.g. stored in the audio controller). It is to be noted that the received data may indicate a plurality of frequencies (and/or volumes) to be provided in the content segment of the intermediate audio signal. The data may for example be received from the safety processor, in which case, the data may also be used by the safety processor (as reference values) when evaluating performance of components of the audio processing system According to an embodiment, the frequency monitor may be adapted to monitor frequency content of a content segment of the output signal corresponding to the content segment of the intermediate audio signal. As operation of the frequency monitor may be verified by the safety processor based on measurements relating to the test segment of the intermediate audio signal, the frequency monitor may be trusted to monitor frequency content relating to other segments/parts of the intermediate audio signal, in particular if these segments are located after the test segment. The monitored frequency content may be compared with the desired frequency in order to ensure that the output audio signal is correct. For example, the safety processor may be adapted to perform this comparison and may be adapted to stop playback of the output audio signal in case a mismatch is detected.

Optionally, the safety processor may be adapted to verify (or declare correct) the operation of at least one component upstream of the audio synthesis stage in response to the frequency content of the content segment of the output audio signal matching (i.e. being equal to or differing at most by a predefined tolerance from) the desired frequency. For example, the safety processor may verify operation of the audio controller or a component/unit from which the audio controller receives an input/control signal.

According to an embodiment, the safety processor may be adapted to represent the desired frequency in a first format and the frequency content of the output signal, provided by the frequency monitor, in a second format. The first and second formats may define non-overlapping value sets, so that the respective representations are distinguishable at all time. In other words, the desired frequency and the measured frequency content are represented and stored in such different formats that they may not be mistaken for each other. For example, a malfunction may not cause the desired frequency to be mistaken for the measured frequency content, which would disable (i.e. make pointless) an evaluation step in which it is checked whether the desired frequency and the measured frequency content match/agree.

According to an embodiment, the audio controller may be adapted to receive an instruction indicating a predetermined audio content segment and to generate the intermediate audio signal based on this instruction. The audio controller may also be adapted to derive at least one checksum or hash value based on the intermediate audio signal. In case the at least one checksum or hash value matches (i.e. is equal to or differs by at most a predefined tolerance from) at least one reference value associated with the predetermined audio content segment, the audio controller may verify the intermediate audio signal.

The predetermined audio content segment may represent desired audio content to be provided in the intermediate audio signal. The at least one reference value associated with the predetermined audio content segment may be at least one checksum or hash value which may have been computed (based on e.g. a reference audio file) and stored during manufacture, deployment, installation or configuration of the audio processing system. The at least one reference value may for instance have been stored in the safety processor and may optionally have been kept separate from the data used by the audio controller as main input data when it to provides the intermediate audio signal.

The received instruction may comprise data from which the predetermined audio content segment (or an approximation thereof) may be derived, or it may comprise an indication of where such data may be obtained/retrieved (for instance, the audio controller may have access to a memory in which a plurality of different audio files is stored, and the received instructions may be a memory pointer or otherwise indicate which of these audio files to use). Alternatively, the received instruction may comprise a stored version of the predetermined audio content segment (e.g. as a digital audio file). However, such data from which the predetermined audio content segment may be derived may have been corrupted or lost since the time it was stored. Moreover, even if the stored data is still correct, the received instruction itself may have been corrupted so that it comprises incorrect data. For example, data in the received instruction may have been loaded or transmitted incorrectly from a memory in which it has been stored. Yet another potential error source is the processing of the received instruction by the audio controller. Hence, the intermediate audio signal generated by the audio controller may differ from the predetermined audio content segment and it may need to be checked by comparing it to the predetermined audio content segment using control sums or hash values.

In case the received instruction is an audio file, the audio controller may for example provide the intermediate audio signal by relaying/reproducing the received audio file/signal. Alternatively, the audio controller may provide the intermediate audio signal by processing and/or adding content to the received audio file/signal. For example, the audio file/signal signal may be received without a predefined test segment with the predefined test frequency. In such an example, the audio controller may be adapted to append the predefined test segment to the received audio file/signal in order to provide an intermediate audio signal suitable for performing the audio test discussed above.

It is to be noted that the audio controller, the audio synthesis stage, the frequency monitor, the frequency-selective audio sensor and the safety processor may be separate units/components in some embodiments, while in other embodiments, at least some of these may be functional aspects of one or more multi-purpose components/units.

According to the present invention, the safety processor and the frequency-selective audio sensor may be used to verify operation of the audio synthesis stage and the frequency monitor, and at least in some embodiments also of the audio controller. The components that may be verified in this way need not necessarily be trusted before verification, but it may be desirable to ensure that the safety processor and the frequency-selective audio sensor are reliable enough to be trusted to perform these verifications. Hence, the safety processor and the frequency-selective audio sensor may preferably execute trusted software which has been verified according to a safety standard.

It is emphasized that the invention relates to all combinations of features, even if they are recited in mutually different claims. In particular, it will be appreciated that any of the features in the embodiments described above for the audio processing system according to the first aspect of the present invention may be combined with the embodiments of the method according to the second aspect of the present invention.

The present invention may also be embodied as a computer program product including a computer-readable medium with computer-executable instructions operable to cause a programmable computer to perform the method according to the second aspect of the invention. Computer readable media may comprise computer storage media (or non-transitory media) and communication media (or transitory media). As is well known to a person skilled in the art, the term computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, compact discs (CD), digital versatile disks (DVD) or other optical disk storage, magnetic cassettes, magnetic tape, magnetic disk storage or other magnetic storage devices, or any other medium which can be used to store the desired information and which can be accessed by a computer. Further, it is well known to the skilled person that communication media typically embodies computer readable instructions, data structures, program modules or other data in a modulated data signal such as a carrier wave or other transport mechanism and includes any information delivery media.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, on which.

All the figures are schematic, not necessarily to scale, and generally only show parts which are necessary in order to elucidate the invention, wherein other parts may be omitted or merely suggested.

DETAILED DESCRIPTION OF EMBODIMENTS

An audio processing system according to an embodiment of the present invention will now be briefly described with reference to FIGS. 1 and 8. More detailed descriptions of audio processing systems according to embodiments of the present invention will be given later, with reference to FIGS. 2 to 7.

Figure 1:
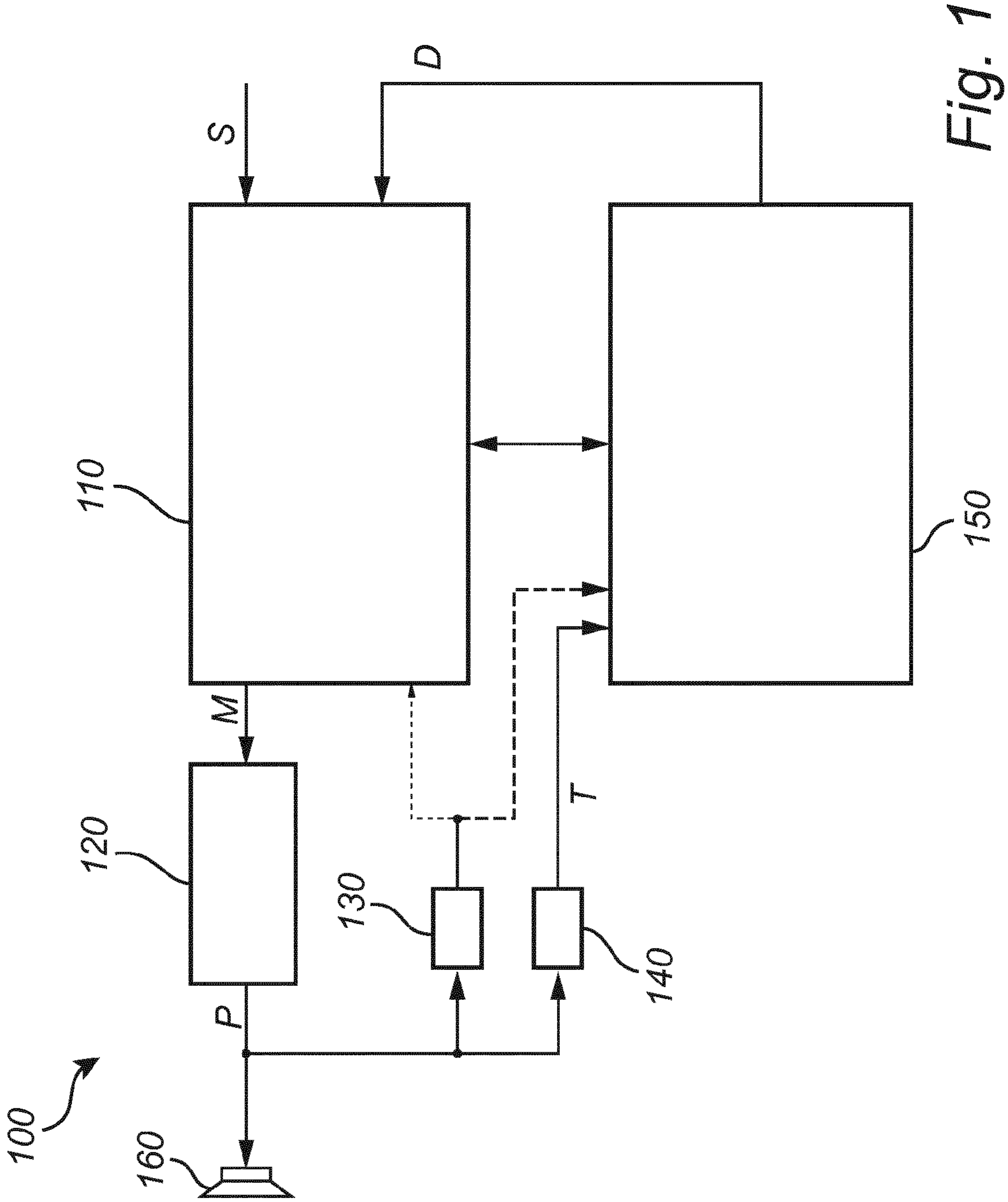
FIG. 1 schematically shows an audio processing system for playback of an audio file, and for generation and playback of a desired frequency, according to an embodiment of the present invention.

FIG. 1 shows an audio processing system 100 comprising an audio controller 110, an audio synthesis stage 120, a frequency monitor 130, a frequency-selective audio sensor 140 and a safety processor 150. FIG. 8 is a general outline of a method 800 performed by, e.g., the audio processing system 100. The audio controller 110 provides 801 an intermediate audio signal M having a predefined test segment comprising a predefined test frequency component. The audio synthesis stage 120 provides 802, based on the intermediate audio signal M, an audio output signal P which is transmitted to one or more loudspeakers 160 (or any other type of acoustic transducers) for audio playback. The frequency monitor 130 monitors 803 frequency content of the output audio signal P and informs (or reports to) the audio controller 110 and/or the safety processor 150 about this frequency content. The frequency-selective audio sensor 140 is tuned to the predefined test frequency and monitors the output audio signal P by detecting 804 presence of any frequency component in the output audio signal P having the predetermined test frequency. The frequency-selective audio sensor 140 transmits one or more audio test signals T to the safety processor 150 as part of an audio test performed in at least a first segment of the output audio signal P corresponding to the predefined test segment of the intermediate audio signal M. If the result of this audio test is positive, the safety processor 150 verifies 805 operation of the audio synthesis stage 120 (i.e. declares it to be correct). If both the frequency monitor 130 and the frequency-selective audio sensor detect the predefined test frequency in the first segment of the output audio signal P, corresponding to the test segment of the intermediate audio signal M, the safety processor 150 verifies 806 operation of the frequency monitor 130. The frequency monitor 130 and the frequency-selective audio sensor 140 may operate independently of each other, i.e. the monitoring 803 of frequency content and the detecting 804 of test frequency components may be performed in any order.

The intermediate audio signal M may be based on data D from the safety processor 150. The data D may indicate a desired frequency to be played for a desired duration. A volume, at which the desired frequency is to be played, may also be indicated by the data D. Alternatively, information about this volume may be received from another component, or may be predetermined since installation or configuration of the audio processing system 100, e.g., may have been set prior to use.

The intermediate audio signal M may be based on a received instruction S indicating a predetermined audio content segment. The instruction S may be received by the audio controller 110 in the form of an audio file which is to be included in the intermediate audio signal M. The received audio file may be a stored, and possibly corrupted, version of the predetermined audio content segment.

In some embodiments, the audio controller 110 is adapted to base the intermediate audio signal M on received data D. In other embodiments, it is adapted to base the intermediate audio signal M on received instructions S. In still further embodiments, it is adapted to base the intermediate audio signal M on either received data D or received instructions S, depending on which of the two types on information is received.

The audio controller 110 and the safety processor 150 may be processors or any other type of processing means. The safety processor 150 may be a more reliable and/or a more trusted component than at least some of the other components of the audio processing system 100, since it is used to verify operation of the other components. The safety processor 150 may preferably execute trusted software which has been verified according to a safety standard. In this way, the reliability of the safety processor 150 may be used to extend trust to other, a priori less reliable, components of the audio processing system 100. The less reliable components may for example be cheaper/simpler components, or multi-purpose components which may potentially have been affected, changed or corrupted when performing other tasks, e.g., tasks not related to safe audio playback. The use of a safety processor 150 to verify other components in this way enables a more reliable audio playback in systems in which not all components may be trusted a priori. The frequency-selective audio sensor 130 is preferably a more trusted or reliable component than the audio monitor 140, as the frequency-selective audio sensor 130 is used by the safety processor 150 when evaluating operation of the frequency monitor 140.

Figure 2:
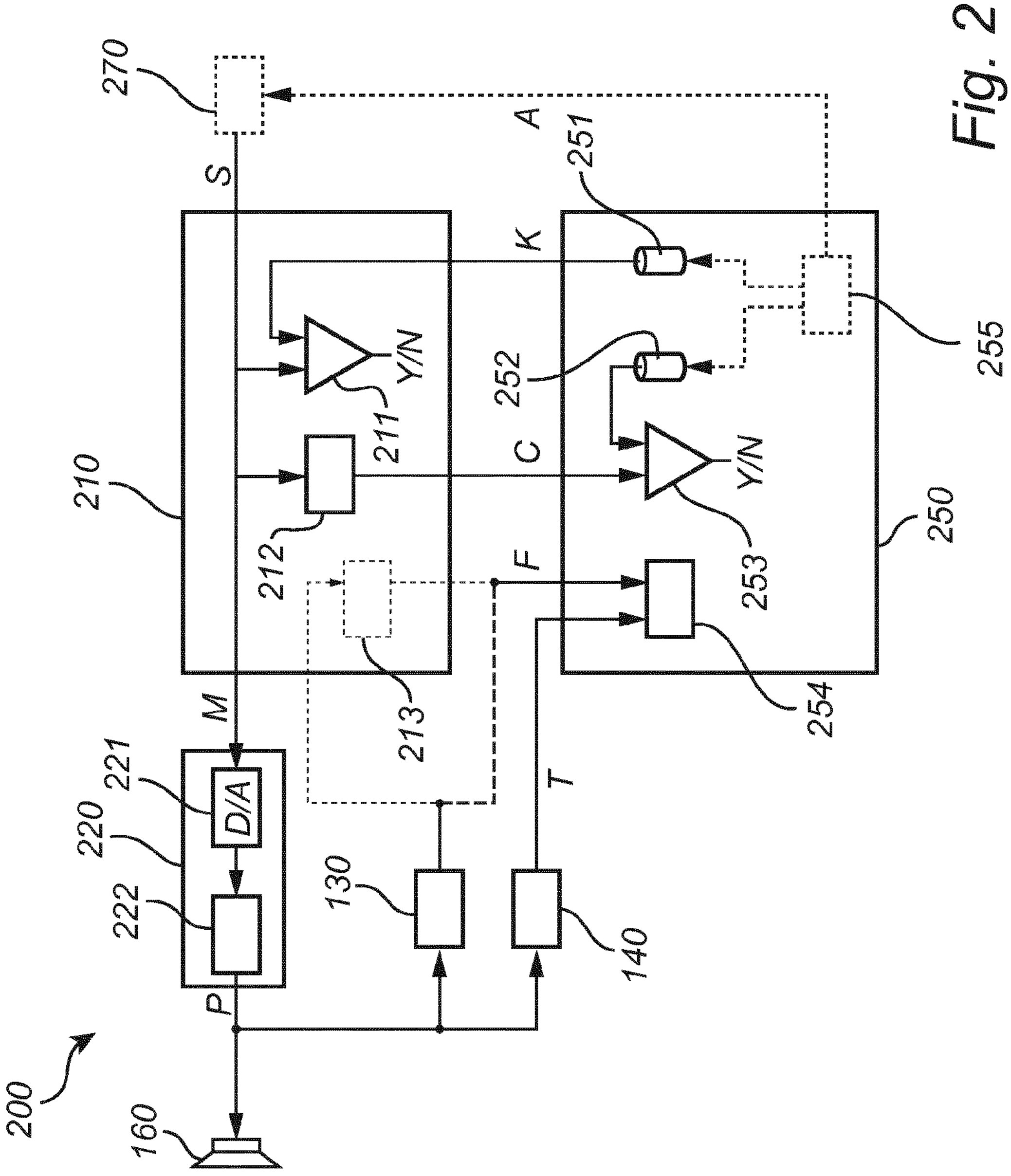
FIG. 2 schematically shows an example implementation of an audio processing system for playback of an audio file, according to an embodiment of the present invention.
Figure 3:
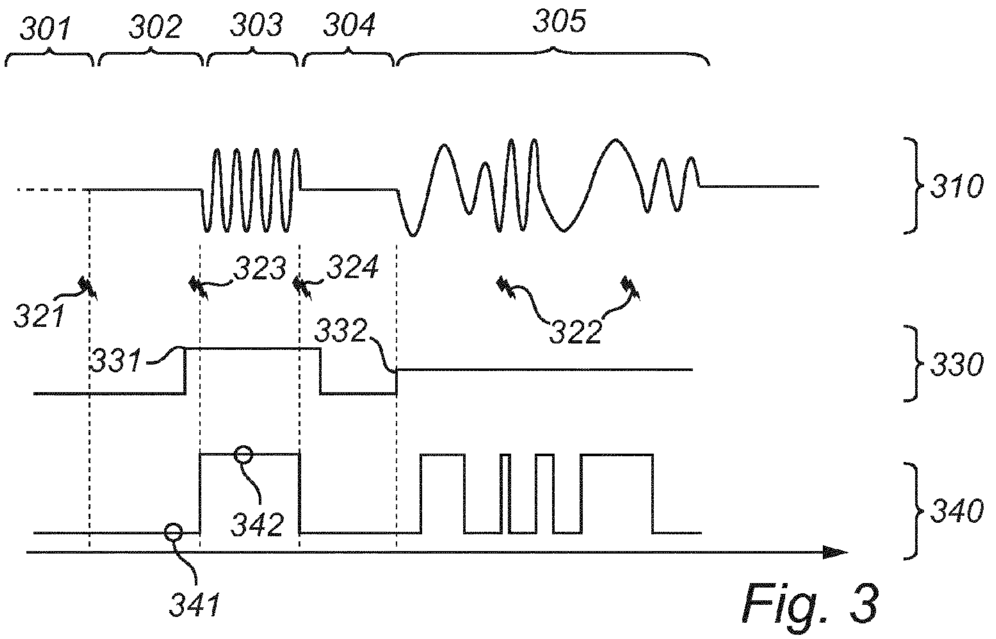
FIG. 3 is a schematic overview of signals used in the audio processing system depicted in FIG. 2.

A more detailed description will now be given, with reference to FIGS. 2 and 3, of an audio processing system similar to the audio processing system 100 depicted in FIG. 1. FIG. 2 shows an audio processing system 200 for playback of an audio file and FIG. 3 shows signals used by the audio processing system 200 to perform this audio playback.

A digital audio file 310 has been stored in a memory 270, e.g., during manufacture, deployment, installation or configuration of the audio processing system 200. The memory 270 may be located in one of the components of the audio processing system 200, or may be external to the audio processing system 200. The audio file 310 comprises four segments: a key sequence or ID 301 for identifying the audio file 310, a first silent segment 302, a predefined test segment 303, a second silent segment 304 and a content segment 305. The test segment 303 comprises a test frequency component, i.e. a component having a frequency equal to a predefined test frequency. The reason for including this test frequency component is its use in evaluating operation of components of the audio processing system 200. This frequency is preferably outside human hearing range so that it is not heard if played by/at the loudspeaker 160. It may be desirable to use a test frequency close to or at least not too far removed from human hearing range (such as 24 kHz), for the abovementioned evaluation to accurately predict operation of the audio processing system 200 for frequencies within human hearing range.

The ID 301 of the audio file 310 has been stored in a memory 251 in the safety processor 250, e.g. it was stored when the audio file 310 was stored in the memory 270. Checksums or hash values for the audio file 310 have been computed and stored in a memory 252 of the safety processor 250. The memories 251 and 252 may coincide, or may be separate components/units. When the audio file 310 is to be played at the loudspeaker 160, the audio file 310 is received by the audio controller 210 from the memory 270. Hence, in the present embodiment, the audio file acts 310 as a received instruction S indicating a desired audio content segment to be included in the intermediate audio signal M. The audio file S received by the audio controller 210 may not be identical to the audio file once saved in the memory 270. Indeed, the saved audio file may have been corrupted or changed when saved, stored, loaded, transmitted or received. The received audio file S is therefore evaluated and verified using the stored ID and checksums. In the following, the audio file 310, depicted in FIG. 3, will refer to the version of the audio file received by the audio controller 210, and may not be identical to the originally stored audio file.

The audio controller 210 checks the ID 301 of the received audio file 310 and compares it with the ID stored in the memory 251 of the safety processor 250, e.g., received as an ID signal K. This comparison is illustrated in FIG. 3 by a comparator 211. In other words, the comparator 211 compares the ID of the received audio file 310 (where the audio file 310 is received from the memory 270) with the ID stored in the memory 251 of the safety processor 250. The output signal "Y/N" of the comparator 211 indicates whether the two IDs match. In case the ID 301 is incorrect, the audio controller 210 may shut down audio playback, e.g. by cancelling output of the intermediate audio signal M. In case the ID 301 is correct, the audio controller 210 forms the intermediate audio signal M by simply reproducing the received audio file 310 (or at least parts of it, e.g. everything but the ID 301). Hence, the intermediate audio signal M will sometimes be referred to in terms of the audio signal 310.

The audio controller 210 calculates checksums (or hash values) based on the received audio file 310 (or based on the intermediate audio signal M which may comprise the same audio file 310, as described above). The check sums may, e.g., be calculated and stored in a dedicated check sum stage 212. There is a multitude of well-known methods for calculating checksums for digital data. The audio controller 210 may preferably perform one or more of these methods. Checksums may be computed for e.g. each 500 ms segment of the audio file 310, (i.e. regardless of any division of the audio file into silent segments 301, 303, test segments 302 or content segments 305). The safety processor 250 may compare the checksums received from the audio controller 210 (or checksum stage 212) via a checksum signal C, to checksums stored in the memory 252. This comparison is illustrated in FIG. 2 by a further comparator 253. In other words, the comparator 253 compares the checksums received from the audio controller 210 (or checksum stage 212) via a checksum signal C, to checksums stored in the memory 252. The output signal "Y/N" of the comparator 253 indicates whether the two checksums match. As long as the checksums match, the received audio file 310 (or outputted intermediate audio signal M) may be regarded as correct and may be verified by the safety processor 250. If a mismatch is detected by the safety processor 250, the playback of the audio signal may be cancelled, e.g. by the safety processor 250 instructing the audio controller 210, the audio synthesizer 220 and/or the loudspeaker 160 to discontinue operation.

The audio synthesis stage 220 may comprise a converter 221 and an amplifier 222. The converter 221 receives the intermediate audio signal M and converts it from a digital signal to an analogue signal. The amplifier 222 then forms the output audio signal P by amplifying the analogue signal, i.e. by setting an amplitude/volume 330. The volume 330 may be different for different segments. For example, the silent segments 302 and 303 in the audio signal 310 may not be amplified, i.e. the volume may be set to zero or to an equivalent neutral value corresponding to no excitation. The test segment 303 may be amplified to a test volume 331 which is high enough for the test frequency to be measured/detected by the frequency monitor 130 and frequency-selective audio sensor 140. The content segment 305 may be amplified to a content volume 332 suitable for attracting the attention of a human user when played at the loudspeaker 160. This content volume 332 may be selected by, e.g., the safety processor 250 or by an external unit from which the audio file 310 is received.

The test segment 303 is used to evaluate the operation of the amplifier 222 (and the converter 221) via an audio test. The frequency-selective audio sensor 130 is adapted to detect presence of frequency components in the output audio signal P having the predefined test frequency and to report this to the safety processor 250 via an audio test signal T, the values of which are indicated in FIG. 3 by the lowermost curve 340. The audio test signal T may be a digital signal, with a first value (e.g. the value 1) if the test frequency is detected with the same amplitude as the test amplitude 331 (or if a frequency within predetermined tolerance interval around the test frequency is detected at an amplitude within a predetermined tolerance interval round the test amplitude), and with a second value (e.g. the value 0) otherwise. During the first silent segment 301, the safety processor 250 may check 341 the audio test signal T to ensure it is equal to the second value as expected, and during the test segment 302 the safety processor 250 may check 342 the audio test signal T to ensure it is equal to the first value as expected. Reception of these two correct values indicates that the amplifier 222 (and the converter 221) functions properly and the operation of the amplifier 222 (and the converter 221) may be verified by the safety processor 250. In case the audio test signal is transmitted also during the content segment 305, the value of the audio test signal may fluctuate between the first and second values depending on the frequency and amplitude of the audio content in the content segment 305.

The frequency monitor 130 may be any type of component adapted to measure and/or detect frequency content of the output audio signal P. The safety processor 250 may receive information F from the frequency monitor 130 about the detected frequency content, either directly or indirectly. In an example embodiment, the frequency monitor 130 comprises a zero-crossing detector generating a pulse for each detected zero-crossing in the audio output signal P. The audio controller 210 may comprise a pulse counter 213 adapted to count the number of pulses received from the zero-crossing detector in a time interval. Information F about the detected frequency content may reach the safety processor 250 in the form of this number of pulses.

As described in relation to FIG. 1, the frequency monitor 130 is verified by the safety processor 250 if the frequency monitor 130 and the frequency selective audio sensor 140 both detect the test frequency in the test segment 303. Indication of these detections may be received by the safety processor 250 via the audio test signal T and the information F from the frequency monitor 130. This is illustrated in FIG. 2 by a frequency monitoring stage 254 receiving the audio test signal T from the frequency-selective audio sensor 140 and the information F from the frequency monitor 130. In other words, the frequency monitoring stage 254 receives the audio test signal T from the frequency-selective audio sensor 140 and the information F from the frequency monitor 130, and determines whether the frequency monitor 130 and the frequency selective audio sensor 140 both detect the test frequency in the test segment 303. The frequency monitoring stage 254 may provide an output signal indicating whether the frequency monitor 130 and the frequency selective audio sensor 140 both detect the test frequency in the test segment 303. The frequency monitor 130 may be verified by the safety processor 250 based on the output signal of the frequency monitoring stage 254. Once operation of the frequency monitor 130 has been verified, it may optionally be used to monitor the frequency content of parts of the output audio signal P corresponding to the content segment 305. Any frequency content detected in this way may optionally be compared with reference frequency content, e.g., content stored in the safety processor 250. For example, the safety processor 250 (or the frequency monitoring stage 254) may compare checksums based on the detected frequencies to corresponding stored reference checksums.

The safety processor 250 may optionally initiate playback of an audio file stored in a memory 270 via an instruction A to the memory 270 to transmit the stored audio file. This is illustrated in FIG. 2 by a control stage 255 indicating to the one or more memories 251, 252 of the safety processor 250 which stored audio file ID and checksums to use.

The audio controller 210 may indicate to the safety processor 250 the beginning/end of different segments of the received audio file 310 using interrupt signals. For example, the audio controller may indicate the end of the ID 301 by sending an interrupt 321, and it may indicate the start and end of the test segment 303 by sending interrupts 323 and 324, respectively. The audio controller 210 may also send interrupts 322 to the safety processor 250 when a new checksum has been calculated and is available for comparison to a stored reference checksum.

Figure 4:
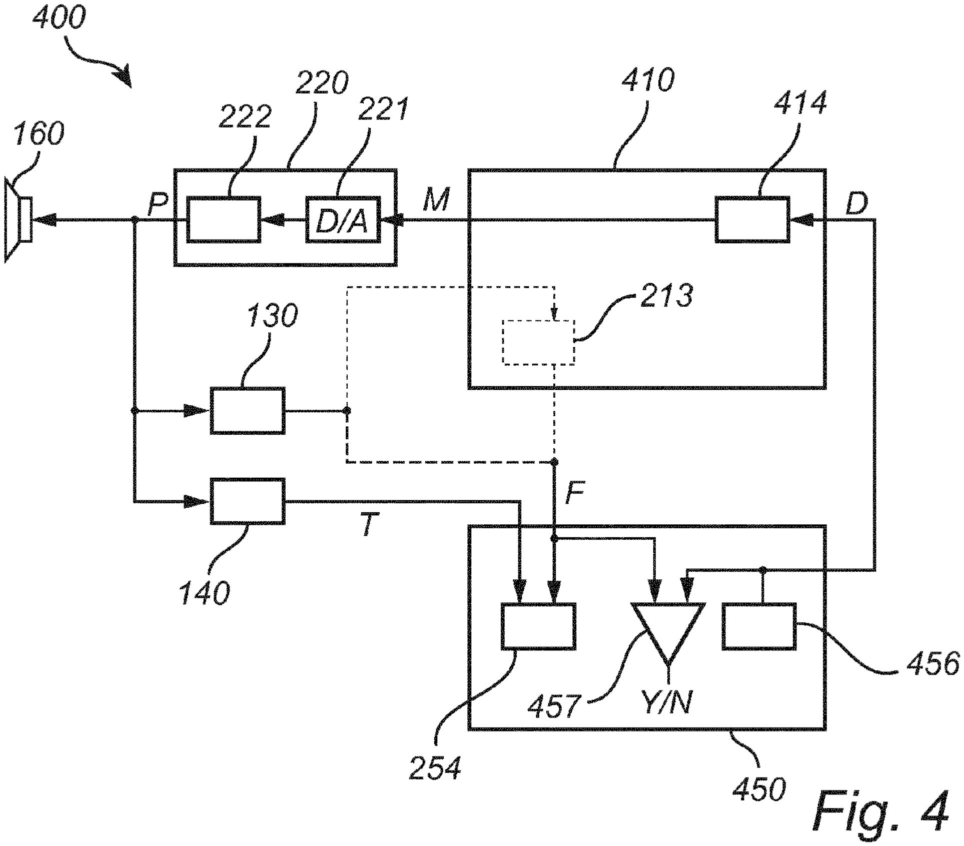
FIG. 4 schematically shows an example implementation of an audio processing system for generation and playback of a desired frequency, according to an embodiment of the present invention.
Figure 5:
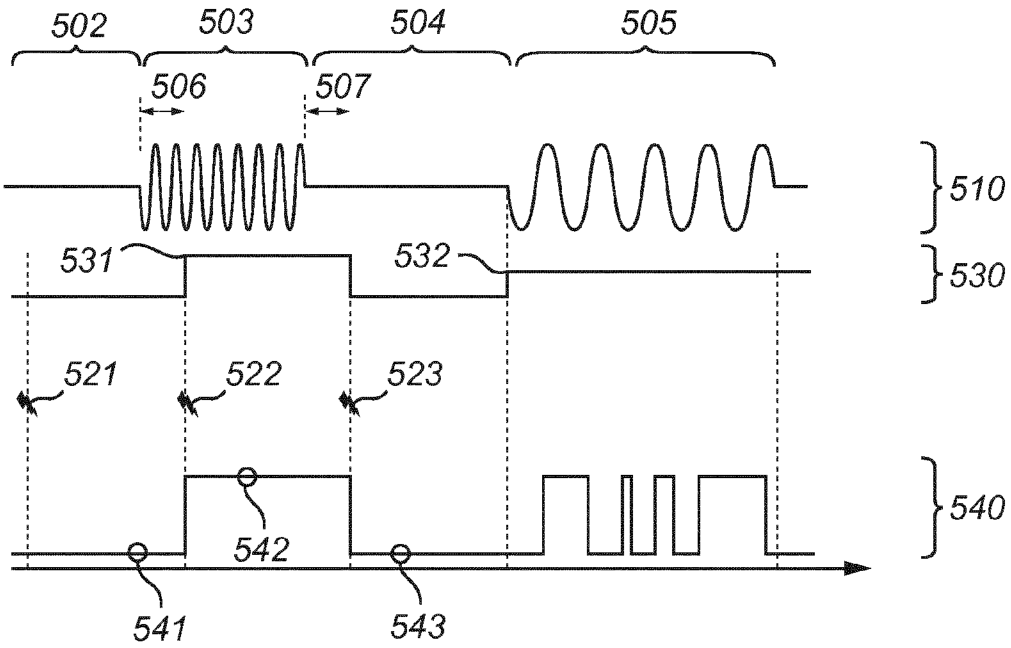
FIG. 5 is a schematic overview of signals used in the audio processing system depicted in FIG. 4.

FIG. 4 shows an audio processing system 400 for generation and playback of a desired frequency, and FIG. 5 shows signals used by the audio processing system 400 to perform this audio playback. The volumes 530 provided by the amplifier 222 are indicated in FIG. 5, and so is a curve 540 illustrating values of the audio test signal T. A difference, as compared to the audio processing system 200 of FIG. 2, is that the audio controller 410 bases the intermediate audio signal M on data D received from the safety processor 450. The data D indicate a desired frequency and duration, based on which an audio generating stage 414 generates an audio file 510 to be transmitted as the intermediate audio signal M. Similarly to the audio file 310 in FIG. 3, the generated audio file 510 comprises two silent segments 502, 504, a predefined test segment 503 and a content segment 505. In case the audio generating stage 414 functions properly, the content segment 505 has the received desired duration and frequency. The audio synthesis stage 220 is verified via an audio test similarly as in the audio processing system 200 of FIG. 2. The audio test signal T indicates whether the test frequency is detected at a test volume 531 and the audio test may involve checking the test signal in at least one sample point 541 in the first silent segment 502 and at least one sample point 542 in the test segment 503. Since the audio file 510 has been generated in the audio generating stage 414, as compared to the audio file 310 which has been received from a memory, additional checks of the audio test signal T may be performed to ensure that a correct output signal P is provided. For example, the audio test signal T may be checked in a sample point 543 in the second silent segment 504 to ensure that the audio processing system 400 is able to handle a transition from a relatively higher volume 531 to a lower volume, such as zero. The safety processor 450 may comprise a frequency monitoring stage 254 of the same type as described above with reference to FIG. 2.

In the present embodiment, the intermediate audio signal M is not necessarily monitored via checksums. Instead, the frequency content of the output audio signal P is monitored by the frequency monitor 130, and the information F about a detected frequency is compared to the desired frequency indicated by D. This comparison is illustrated in FIG. 4 by a comparator 457. In other words, the comparator 457 compares the detected frequency to the desired frequency. The output signal "Y/N" of the comparator 457 indicates whether the two frequencies match. Note that the information F about the detected frequency is preferably represented in a different format (on the bit level) than the desired frequency, to avoid any mix up of these frequencies which may, e.g., cause the desired frequency to be compared to itself instead of to the detected frequency. The desired frequency may, e.g., be selected in the safety processor 450 (the selection indicated by a selection stage 456), and transmitted to the audio controller as a number using a first quantized frequency scale, while the detected frequency may be received as a number using a second scale, the two scales involving non-overlapping sets of quantization indices labeling the frequencies.

The content segment 505 is provided at a volume 532 indicated by, e.g., the safety processor 450. Interrupts 521, 522, 523 may be used by the audio controller 410 to inform the safety processor 450 of when different segments of the audio file 510 are transmitted in order to notify the safety processor 450 when to check the audio test signal T. The interrupts 522, 523 indicating the beginning and end of the test segment 503 may preferably be transmitted with short delays 506, 507 (e.g. 10 ms, if the lengths of the segments are about 100 ms) to ensure that there has been enough time for audio test signal T to be updated to reflect the appropriate segment of the audio file 510.

Figure 6:
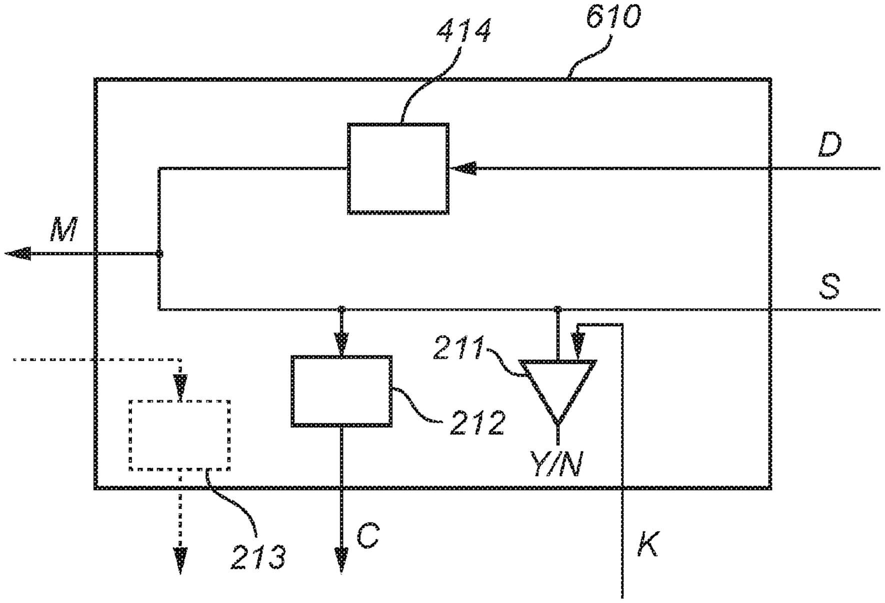
FIG. 6 shows an example implementation of an audio controller adapted to be used in an audio processing system for playback of an audio file, and for generation and playback of a desired frequency, according to an embodiment of the present invention.
Figure 7:
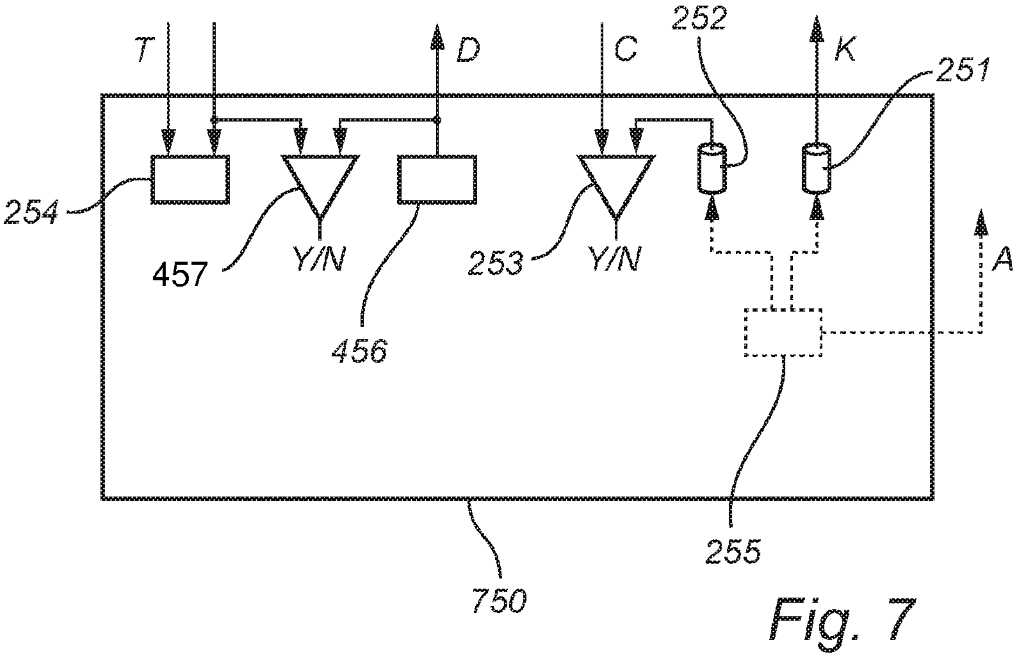
FIG. 7 shows an example implementation of a safety processor adapted to be used in an audio processing system for playback of an audio file, and for generation and playback of a desired frequency, according to an embodiment of the present invention.

FIGS. 6 and 7 show an audio controller 610 and a safety processor 750, respectively, which are adapted for use in audio processing systems for playback of an audio file, and for generation and playback of a desired frequency, according to embodiments of the present invention. The audio controller 610 is adapted to output an intermediate audio signal M based on either received data D or received instructions S in the form of an audio file. The audio controller 610 therefore has all functionalities of the audio controllers 210 and 410, depicted in FIGS. 2 and 4 respectively. Analogously, the safety processor 750 has all the functionalities of the safety processors 250 and 450, depicted in FIGS. 2 and 4, respectively. In particular, the safety processor is 750 adapted to provide a reference ID and to compare checksums with reference values, for each intermediate audio signal M which is based on instructions S (e.g. a received audio file); and to compare the desired frequency sent to the audio controller 610 with the frequency detected by the frequency monitor 130 in each intermediate audio signal M which is based on data D. The audio controller 610 may comprise a comparator 211 of the same type as described above with reference to FIG. 2. The safety processor 750 may comprise a frequency monitoring stage 254 and comparators 253 and 457 of the same types as described above with reference to FIGS. 2 and 4.

Figure 8:
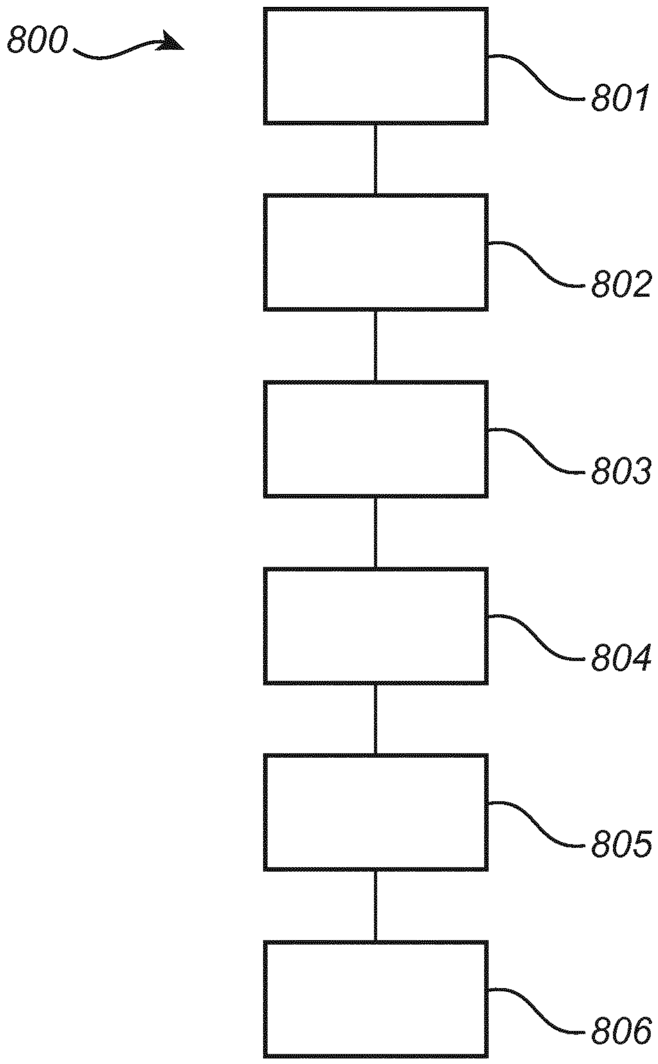
FIG. 8 is a general outline of an audio processing method according to an embodiment of the present invention.

It will be appreciated that any one of the embodiments described above with reference to FIGS. 1 to 7 is combinable and applicable to the method described herein with reference to FIG. 8. While specific embodiments have been described, the skilled person will understand that various modifications and alterations are conceivable within the scope as defined in the appended claims. For example, other tests, evaluations and/or verifications of components and/or signals involved in the audio processing system may be performed in combination with those described above.

The invention claimed is:

1. An audio processing system comprising:

an audio controller operable to output an intermediate audio signal having a predefined test segment comprising a predefined test frequency component;

an audio synthesis stage adapted to provide, based on the intermediate audio signal, an output audio signal for use in audio playback;

a frequency monitor adapted to monitor frequency content of the output audio signal;

an audio sensor adapted to monitor at least a first segment of the output audio signal corresponding to the test segment of the intermediate audio signal; and a safety processor adapted to:

declare correct operation of the audio synthesis stage in response to a positive result of an audio test performed in said first segment of the output audio signal, and declare correct operation of the frequency monitor in response to both the frequency monitor and the frequency-selective audio sensor detecting the test frequency in said first segment of the output audio signal.

2. The audio processing system of claim 1, wherein the audio sensor is a frequency-selective audio sensor tuned to the test frequency.

3. The audio processing system of claim 1, wherein the audio controller is operable to output the test segment of the intermediate signal at a first indicated volume, and wherein the safety processor is adapted to receive a first audio test signal indicating whether an actual volume in said first segment of the output signal is equivalent to said first indicated volume.

4. The audio processing system of claim 3, wherein the audio synthesis stage comprises an amplifier adapted to amplify the intermediate audio signal or a signal derived therefrom.

5. The audio processing system of claim 3, wherein the safety processor is adapted to receive a third audio test signal from the frequency-selective audio sensor indicating a detection, in said first segment of the output audio signal, of the predefined test frequency, the third audio test signal optionally coinciding with the first audio test signal.

6. The audio processing system of claim 1, wherein the audio controller is operable to output an additional test segment of the intermediate signal at a second indicated volume, different from said first volume, and wherein the safety processor is adapted to receive a second audio test signal indicating whether an actual volume in a second segment of the output audio signal, corresponding to said additional test segment of the intermediate audio signal, is equivalent to said second indicated volume.

7. The audio processing system of claim 1, wherein the test frequency is outside human hearing range.

8. The audio processing system of claim 1, wherein the safety processor is adapted to perform a real-time audio test based on frequency content of the output audio signal, provided by the frequency monitor, the safety processor optionally being adapted to declare correct operation of at least one component upstream of the audio synthesis stage in response to a positive result of said real-time audio test.

9. The audio processing system of claim 1, further comprising an acoustic transducer adapted to reproduce the audio output signal without further processing.

10. The audio processing system of claim 1, wherein the audio controller is adapted to:

receive data indicating a desired frequency within human hearing range; and generate, in response to receiving said data, a content segment of the intermediate signal having the desired frequency.

11. The audio processing system of claim 10, wherein the frequency monitor is adapted to monitor frequency content of a content segment of the output signal corresponding to the content segment of the intermediate audio signal.

12. The audio processing system of claim 11, wherein the safety processor is adapted to declare correct operation of at least one component upstream of the audio synthesis stage in response to the frequency content of the content segment of the output audio signal matching the desired frequency.

13. The audio processing system of claim 12, wherein the safety processor is adapted to represent the desired frequency in a first format and the frequency content of the output signal, provided by the frequency monitor, in a second format, the first and second formats defining non-overlapping value sets, so that the respective representations are distinguishable at all time.

14. The audio processing system of claim 1, wherein the audio controller is adapted to:

receive an instruction indicating a predetermined audio content segment;

generate the intermediate audio signal based on said instruction; and derive at least one checksum based on the intermediate audio signal, wherein the safety processor is adapted to declare correct operation of the intermediate audio signal in response to the at least one checksum matching at least one reference value associated with the predetermined audio content segment.

15. An audio processing method, comprising:

providing an intermediate audio signal having a predefined test segment comprising a predefined test frequency component;

synthesizing, based on the intermediate audio signal, an output audio signal for use in audio playback;

monitoring frequency content of the output audio signal;

detecting the test frequency in at least a first segment of the output audio signal independently from the monitoring, wherein the first segment of the output audio signal corresponds to the test segment in the intermediate audio signal;

in response to a positive result of an audio test performed in said first segment of the output audio signal, declaring the synthesizing to operate correctly, and in response to detecting the test frequency in the first segment of the output audio signal, and the monitoring of frequency content of the output audio signal revealing presence of the test frequency in the first segment of the output audio signal, declaring the frequency monitoring to operate correctly.

16. The audio processing method of claim 15, wherein the intermediate audio signal is provided by an audio controller.

17. The audio processing method of claim 16, wherein the monitoring is performed by a frequency monitor and the detecting is performed by an audio sensor.

18. The audio processing method of claim 15, comprising:

providing signaling indicating whether the synthesizing and the frequency monitoring are declared to operate correctly.

19. A computer program product comprising a non-transitory computer-readable medium with instructions for causing a programmable computer to perform the method of claim 15.

* * * * *